United States Patent
Chang et al.

(10) Patent No.: US 7,289,323 B2
(45) Date of Patent: Oct. 30, 2007

(54) WIND-GUIDING COVER

(75) Inventors: Lin-Wei Chang, Taipei (TW);
Chi-Kang Hsieh, Taipei (TW)

(73) Assignee: Inventec Corporation, Shih-Lin District Taipei (TW)

( * ) Notice: Subject to any disclaimer, the term of this patent is extended or adjusted under 35 U.S.C. 154(b) by 0 days.

(21) Appl. No.: 11/393,183

(22) Filed: Mar. 29, 2006

(65) Prior Publication Data

US 2007/0230117 A1 Oct. 4, 2007

(51) Int. Cl.
*H05K 7/20* (2006.01)
*H05K 5/00* (2006.01)

(52) U.S. Cl. ............ 361/695; 361/687; 361/690; 361/694; 454/184

(58) Field of Classification Search ........ 361/690–695; 165/80.3, 104.33; 454/184
See application file for complete search history.

(56) References Cited

U.S. PATENT DOCUMENTS

| | | | | |
|---|---|---|---|---|
| 5,338,214 A | * | 8/1994 | Steffes et al. | 439/160 |
| 5,375,038 A | * | 12/1994 | Hardt | 361/694 |
| 6,400,568 B1 | * | 6/2002 | Kim et al. | 361/697 |
| 6,525,937 B2 | * | 2/2003 | Yanagida | 361/695 |
| 6,643,131 B1 | * | 11/2003 | Huang | 361/697 |
| 7,068,505 B2 | * | 6/2006 | Kosugi | 361/690 |
| 2005/0195568 A1 | * | 9/2005 | Shyr | 361/695 |

FOREIGN PATENT DOCUMENTS

JP    2000138487 A  *  5/2000

* cited by examiner

*Primary Examiner*—Jayprakash Gandhi
*Assistant Examiner*—Robert J. Hoffberg
(74) *Attorney, Agent, or Firm*—Fulbright & Jaworski (57) ABSTRACT

A wind-guiding cover is provided, which is mounted in an electronic device having a heat generating component, a first coupling portion, a first positioning portion and an air inlet, wherein the heat generating component has a fan. The wind-guiding cover includes a main body and a separator. The main body is disposed between the heat generating component and the air inlet, and includes a channel for connecting the heat generating component to the air inlet, and a second coupling portion for being coupled to the first coupling portion, so as to allow the fan to directly introduce cooling air from the air inlet to the heat generating component to dissipate heat generated by the heat generating component. The separator is connected to a side of the main body and has a second positioning portion for being coupled to the first positioning portion.

8 Claims, 7 Drawing Sheets

WIND-GUIDING COVER

FIELD OF THE INVENTION

The present invention relates to wind-guiding covers, and more particularly, to a wind-guiding cover applied to an electronic device.

BACKGROUND OF THE INVENTION

As the technology advances, electronic devices have become part of life for the modern people. An electronic device (for example a computer server) consists of many parts such as disk drive, power supply and mainboard, wherein the mainboard is provided with many electronic components thereon such as memory, IC component, central processing unit (CPU) and so on. With functionality of the electronic device being continuously enhanced, the number of the electronic components mounted in the electronic device is also increased. Accordingly, when the electronic device operates, more and more heat is generated by the electronic components and heat generating components of the electronic device. Therefore, how to dissipate the heat satisfactorily for the electronic components and the heat generating components has become an issue to be solved at present.

Figure 1:
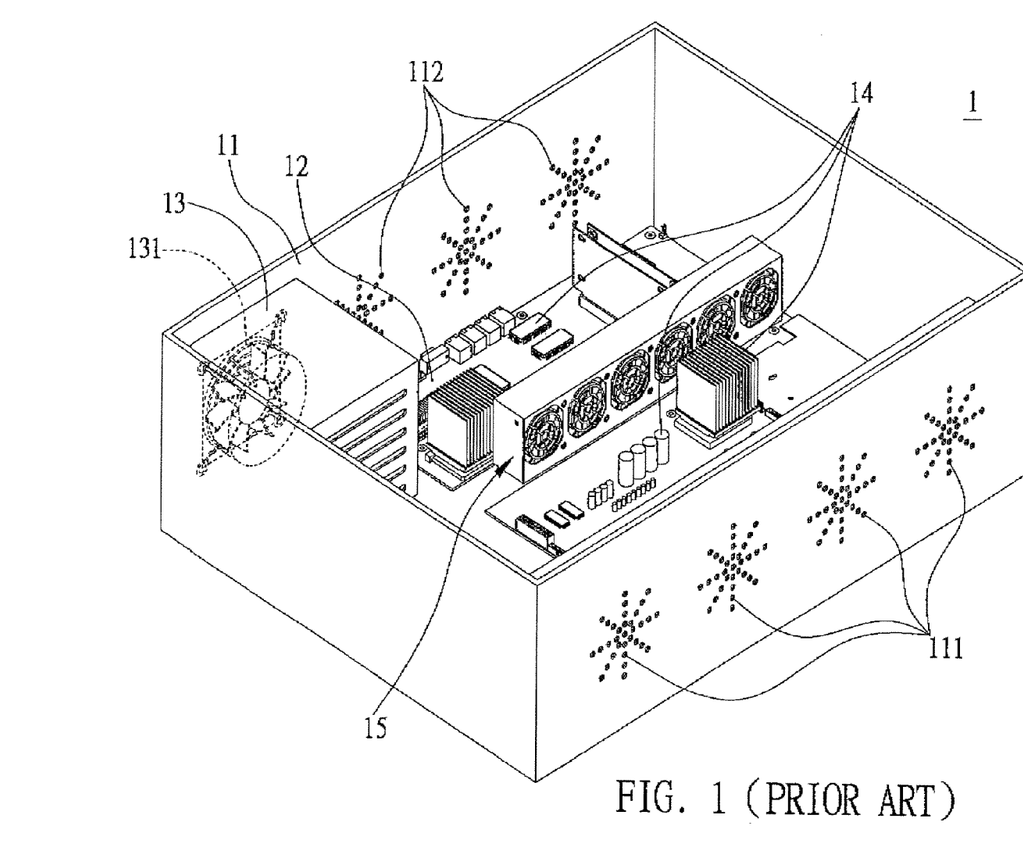
FIG. 1 (PRIOR ART) is a schematic diagram illustrating a heat dissipating condition of a conventional electronic device.

Referring to FIG. 1, a conventional server 1 is provided with a plurality of fans 15 and a heat generating component 13 (such as a power supply) in an electronic device 11 thereof, wherein a fan 131 is mounted in the heat generating component 13 to dissipate heat generated by the heat generating component 13 to outside of the server 1. The plurality of fans 15 operate to introduce air from outside of the server 1 to the electronic device 11 through an air inlet 111 of the electronic device 11 so as to dissipate heat generated by electronic components 14 mounted on a mainboard 12 to outside of the sever 1 through an air outlet 112 of the electronic device 11. Thereby, heat dissipation is performed for the heat generating component 13 and the electronic components 14.

During the heat dissipating process for the heat generating component 13 of the server 1, the fan 131 in the heat generating component 13 operates to dissipate the heat generated by the heat generating component 13. However, the plurality of fans 15 during operation would also draw the heat from the heat generating component 13, which is intended to be dissipated, into the server 1, thereby adversely affecting the heat dissipation operation for the heat generating component 13 and making the heat generating component 13 not subject to satisfactory heat dissipation. Moreover, when more and more heat is introduced to the server 1, it may cause damage to the electronic components 14 and the heat generating component 13.

Figure 2:
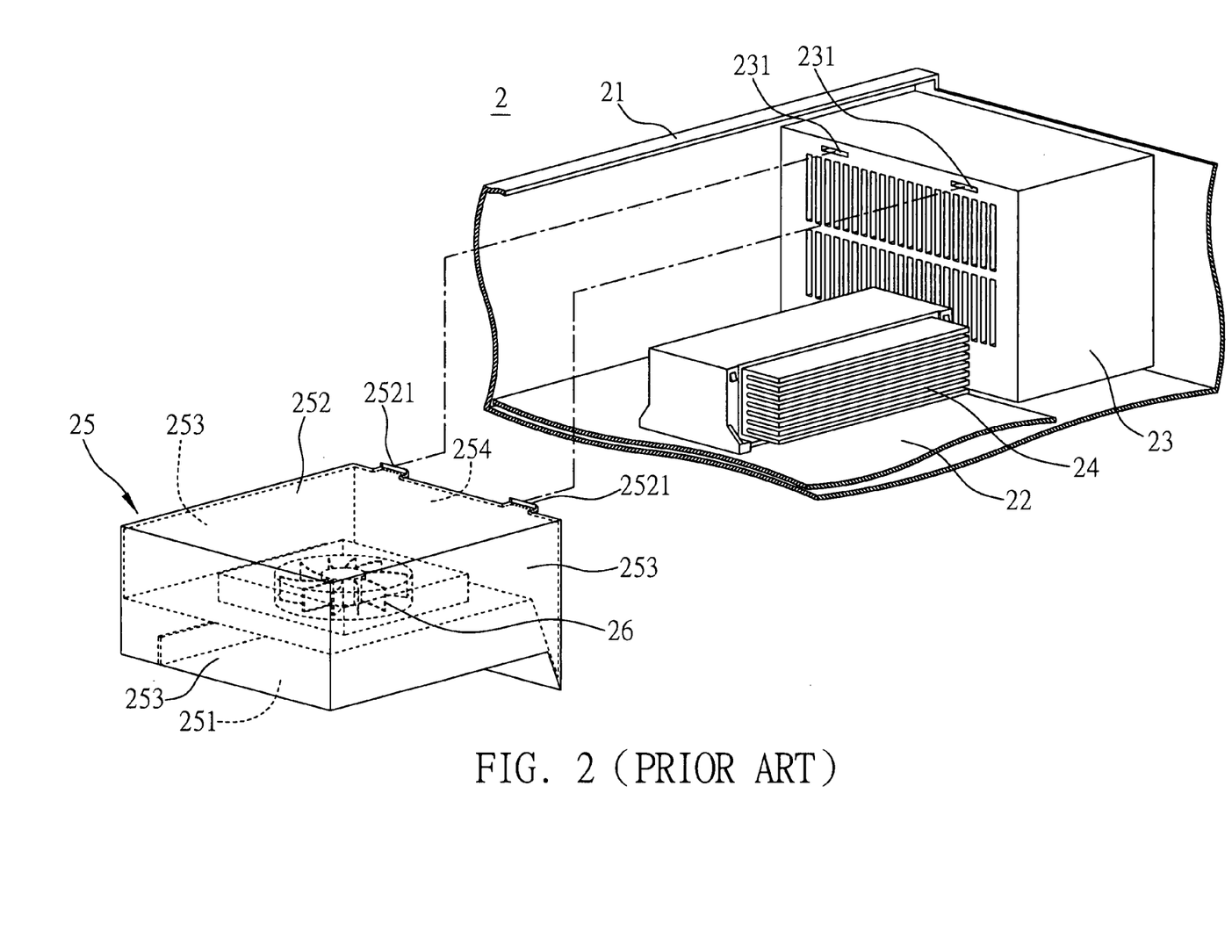
FIG. 2 (PRIOR ART) is a perspective schematic diagram of a conventional wind-guiding cover for a computer heat dissipating device.
Figure 3:
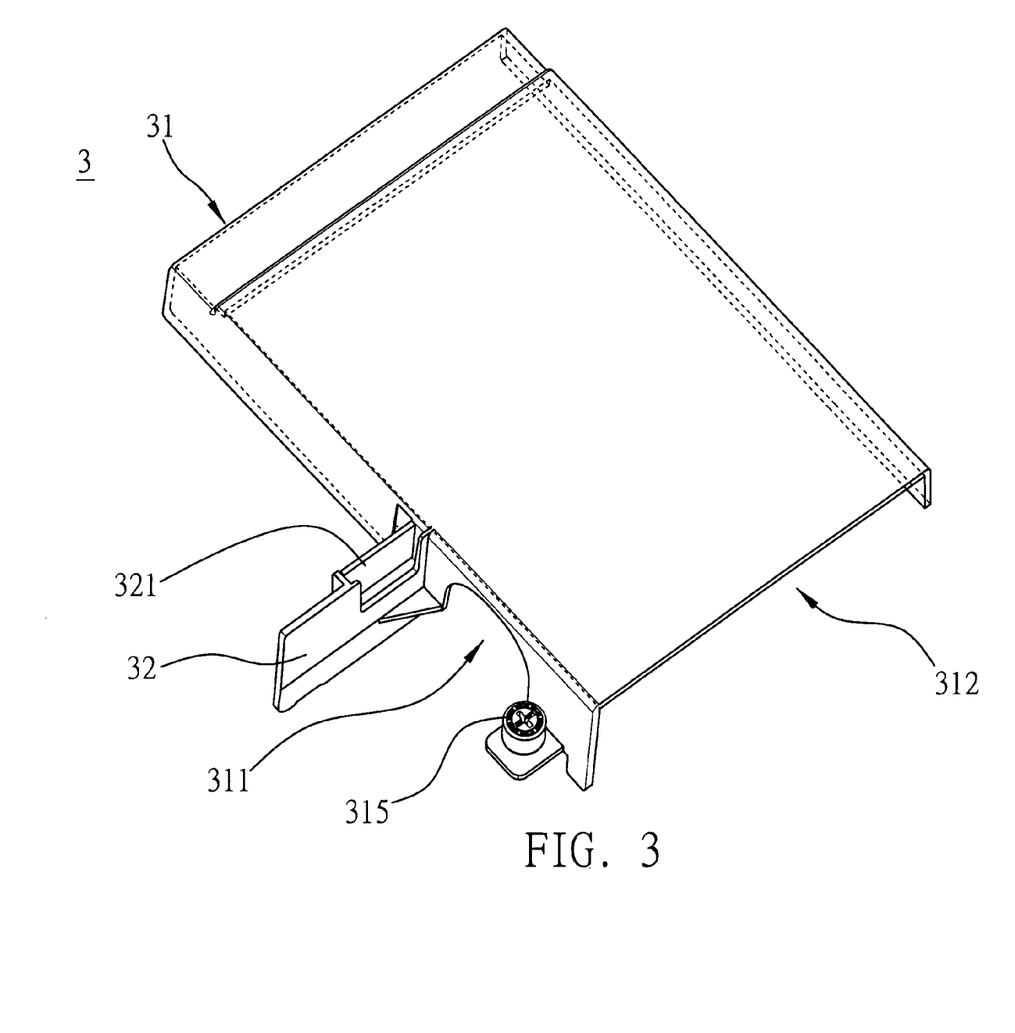
FIG. 3 is a perspective schematic diagram of a wind-guiding cover according to a first preferred embodiment of the present invention.
Figure 4:
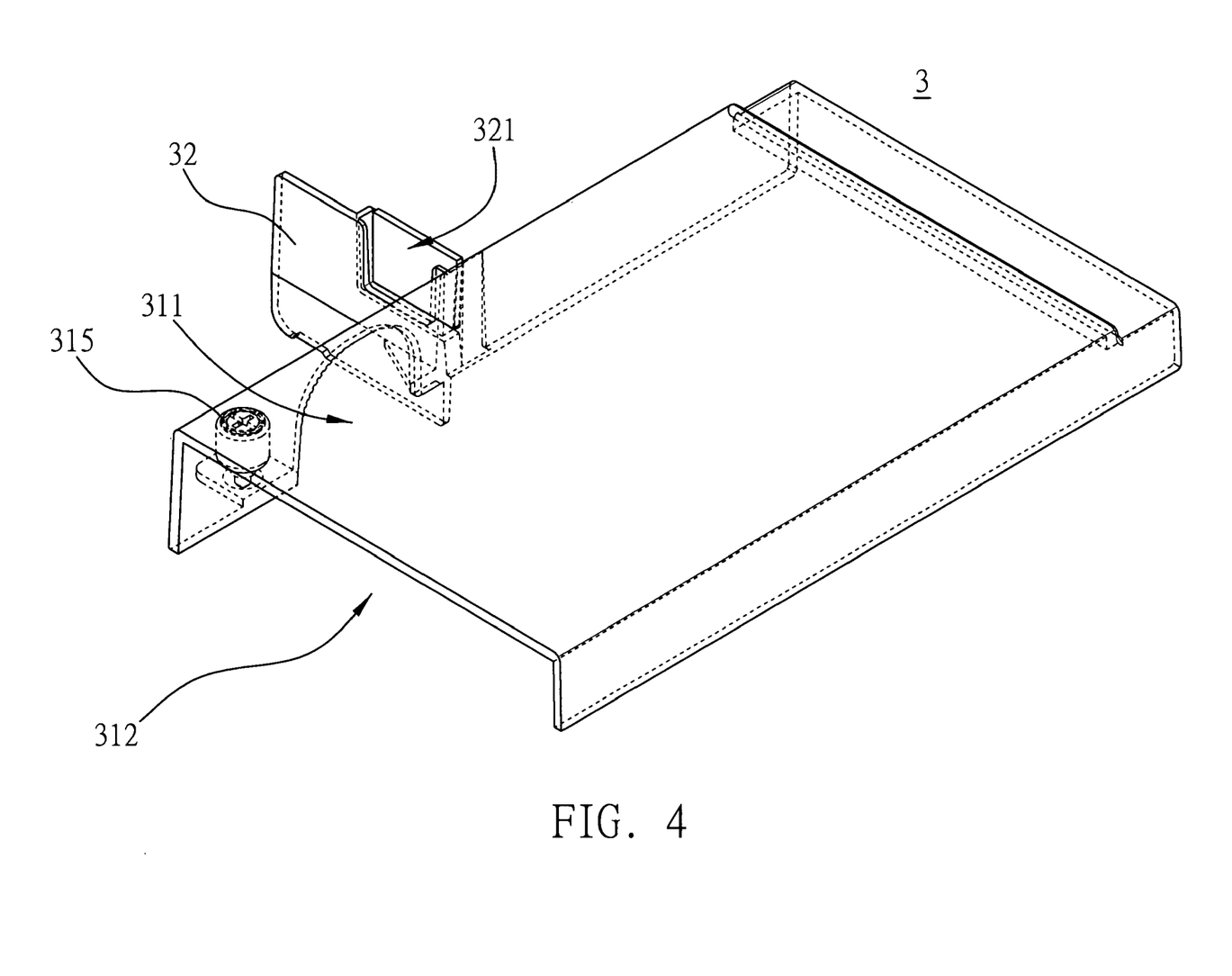
FIG. 4 is another perspective schematic diagram of the wind-guiding cover according to the present invention.

Accordingly, there has been proposed a conventional wind-guiding cover 25 for a computer heat dissipating device 2. As shown in FIG. 2, a mainboard 22 and a power supply 23 are formed in an electronic device 21 of the computer heat dissipating device 2, and an electronic component such as CPU 24 is disposed on the mainboard 21 at a position near the power supply 23. The wind-guiding cover 25 is disposed on the CPU 24, which produces relatively more heat and should be subject to sufficient heat dissipation, and beside the power supply 23. The wind-guiding cover 25 has a box-shape, and comprises a bottom board 251, a top board 252, a three-side board 253 for connecting the bottom board 251 to the top board 252, an opening 254, and a fan 26 connected to the bottom board 251. A plurality of hooks 2521 are formed on a side of the top board 252. A plurality of grooves 231 are formed in the power supply 23. The hooks 2521 can be engaged with the grooves 231 to couple the wind-guiding cover 25 to the power supply 23. As such, the fan 26 connected to the bottom board 251 of the wind-guiding cover 25 is located at a position right corresponding to the CPU 24 of the mainboard 22, such that the fan 26 operates to dissipate heat generated by the CPU 24 and the power supply 23 to outside of the computer heat dissipating device 2 through an opening (not shown) formed between the power supply 23 and the electronic device 21.

However, the above wind-guiding cover 25 must be provided with the fan 26 therein, which undesirably increases the cost. Further, during the heat dissipating process for the CPU 24 and the power supply 23, the heat generated by the CPU 24 passes through the power supply 23 to be dissipated out of the computer heat dissipating device 2, such that the power supply 23 experiences the heat from the CPU 24 and cannot be subject to a satisfactory heat dissipating effect.

Therefore, the problem to be solved here is to provide a wind-guiding cover, which can improve a heat dissipating effect for a heat generating component of an electronic device, and achieve satisfactory heat dissipation for the heat generating component and an electronic component of the electronic device respectively and prevent interference therebetween, so as to overcome the drawbacks in the prior art.

SUMMARY OF THE INVENTION

In light of the above drawbacks in the prior art, an objective of the present invention is to provide a wind-guiding cover to improve a heat dissipating effect for a heat generating component of an electronic device.

Another objective of the present invention is to provide a wind-guiding cover that is easy to be assembled and disassembled to and from an electronic device.

Still another objective of the present invention is to provide a wind-guiding cover having a function of wiring arrangement.

A further objective of the present invention is to provide a wind-guiding cover to achieve a satisfactory heat dissipating effect for a heat generating component and an electronic component of an electronic device respectively and prevent interference therebetween.

In accordance with the above and other objectives, the present invention proposes a wind-guiding cover mounted in an electronic device having a heat generating component, a first coupling portion, a first positioning portion and an air inlet, the heat generating component having a fan. The wind-guiding cover comprises: a main body and a separator. The main body is disposed between the heat generating component and the air inlet, and comprises a channel for connecting the heat generating component to the air inlet, and a second coupling portion for being coupled to the first coupling portion, so as to allow the fan to operate to directly introduce cooling air from the air inlet to the heat generating component to dissipate heat generated by the heat generating component. The separator is connected to a side of the main body and has a second positioning portion for being coupled to the first positioning portion.

Preferably, the first coupling portion and the second coupling portion comprise a screw hole and a screw member, respectively, wherein the screw member is a positioning bolt that can be coupled and fixed to the main body. The first positioning portion is a slot formed on a side of a fan frame of the electronic device, and the second positioning portion is a protruding block formed on the separator. The main body has an opening formed on a side thereof relatively close to the separator, to allow wiring for connecting the heat generating component to the electronic device to penetrate the opening. The separator further has a window board that is removable to form a gap on the separator. The heat generating component can be a power supply, and the electronic device can be a server.

By applying the wind-guiding cover of the present invention to the electronic device and through operation of the fan and a heat dissipating member of the electronic device, heat generated by electronic components of the electronic device and the heat generating component can be dissipated out of the electronic device. This can solve the problem in the prior art that a heat generating component cannot be subject to satisfactory heat dissipation and its heat dissipating operation is adversely affected as heat generated by the heat generating component and to be dissipated is undesirably drawn into a server by operation of a plurality of fans of the server. Therefore, the wind-guiding cover of the present invention can achieve a satisfactory heat dissipating effect for the electronic components and the heat generating component of the electronic device.

Moreover, the wind-guiding cover of the present invention can solve the other problems in the prior art, such as increase in the cost due to necessarily providing a fan in a conventional wind-guiding cover, unsatisfactory heat dissipation for the heat generating component (such as power supply) and the electronic components, and so on.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a wind-guiding cover proposed in the present invention are described as follows with reference to FIGS. 3 to 7. It is to be noted that the drawings are simplified schematic diagrams and only show components relating to the present invention. In practice, the layout of components could be more complicated. It should be understood that the following embodiments are not construed to limit the scope of the present invention.

First Preferred Embodiment

Figure 5:
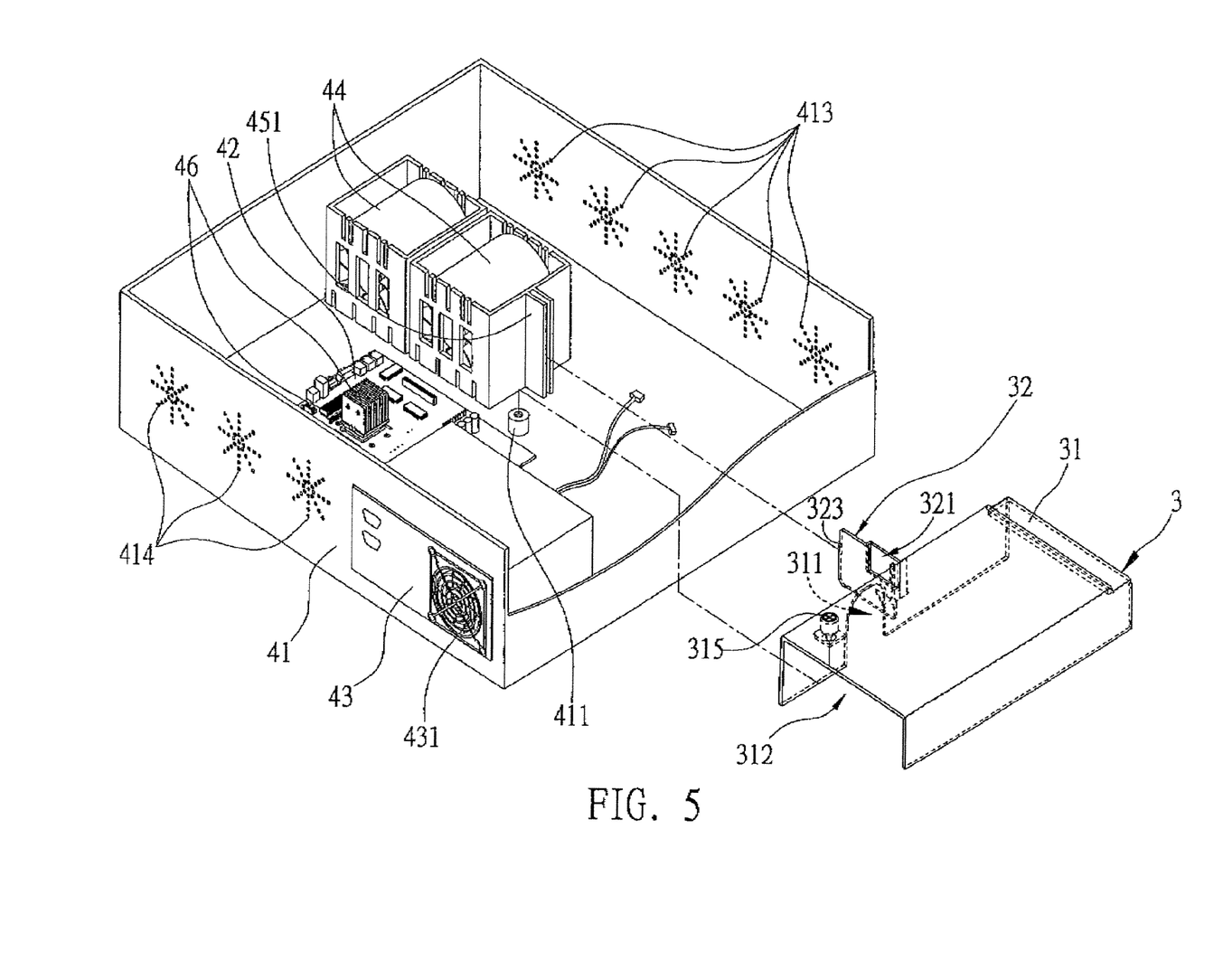
FIG. 5 is a perspective schematic diagram of the wind-guiding cover according to the present invention and an electronic device to which the wind-guiding cover is applied.
Figure 6:
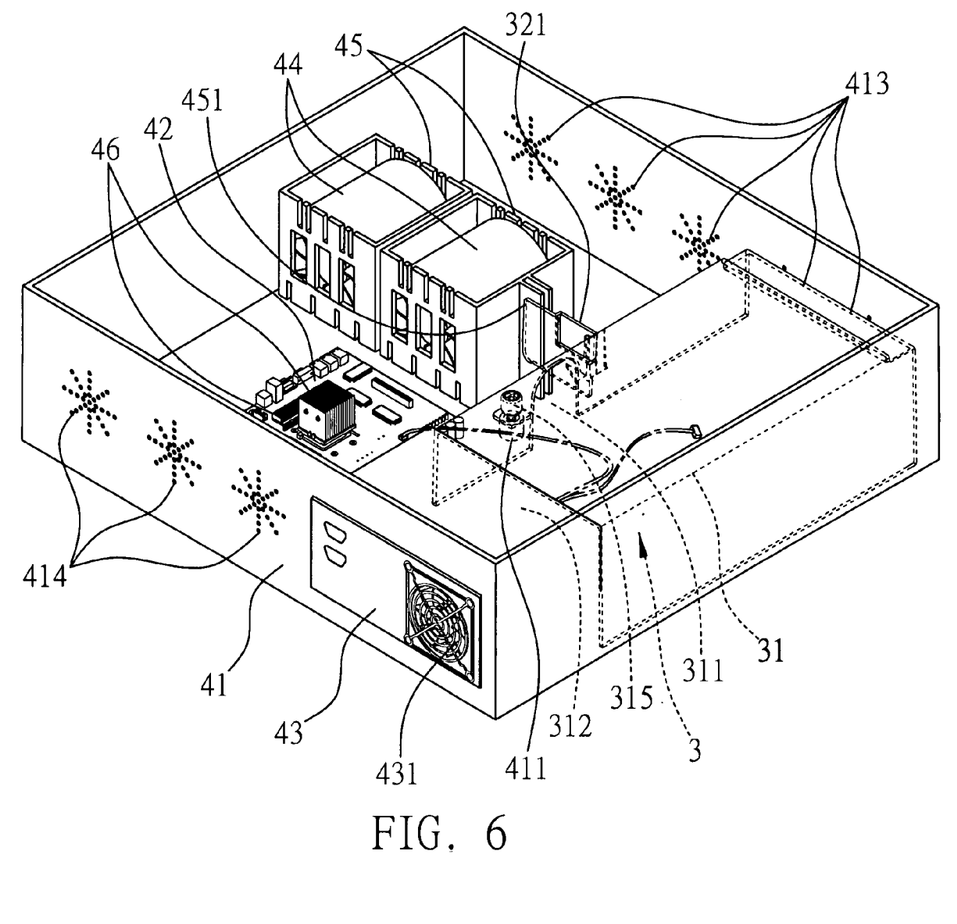
FIG. 6 is a perspective schematic diagram of the wind-guiding cover according to the present invention being mounted in the electronic device.

FIGS. 3 to 6 shows a wind-guiding cover 3 according to a first preferred embodiment of the present invention. As shown in FIG. 6, the wind-guiding cover 3 is mounted in an electronic device 41 having a heat generating component 43, a first coupling portion 411, a first positioning portion 451 and an air inlet 413, wherein the heat generating component 43 has a fan 431. The wind-guiding cover 3 comprises a main body 31 and a separator 32 connected to the main body 31.

It should be noted that the wind-guiding cover 3 in the following embodiments can be applied to the electronic device 41 such as a desktop computer, a laptop computer, a server or any other electronic device having a heat dissipating member (such as a fan) 44 and the heat generating component 43 (such as a power supply). Although the embodiments herein take the server for illustration, it is understood that the present invention is not limited to such arrangement. For the sake of simplicity, the drawings herein only show relevant part of structure of the electronic device 41 for use with the wind-guiding cover 3 of the present invention.

As shown in FIG. 5, the main body 31 is disposed between the heat generating component 43 and the air inlet 413. The main body 31 comprises a channel 312 for connecting the heat generating component 43 to the air inlet 413, and a second coupling portion 315 for being coupled to the first coupling portion 411 of the electronic device 41, wherein the first coupling portion 411 and the second coupling portion 315 comprise a screw hole and a screw member, respectively, and the screw member is a positioning bolt that can be coupled and positioned to the main body 31. The first positioning portion 451 is a slot formed on a side of a fan frame 45 of the electronic device 41. The main body 31 has an opening 311 formed on a side thereof relatively close to the separator 32, to allow wiring for connecting the heat generating component 43 to the electronic device 41 to penetrate the opening 311. Thereby, the fan 431 can operate to directly introduce cooling air from the air inlet 413 to the heat generating component 43 to dissipate heat generated by the heat generating component 43.

The separator 32 is connected to a side of the main body 31, and has a second positioning portion 323 for being coupled and positioned to the first positioning portion 451 of the electronic device 41. The second positioning portion 323 is a protruding block that can be coupled to the first positioning portion 451 (such as a slot).

Further as shown in FIG. 6, when it is to assemble the wind-guiding cover 3 to the electronic device 41, firstly, the wind-guiding cover 3 is placed on the electronic device 41 to allow the second coupling portion 315 thereof to be coupled to the first coupling portion 411 of the electronic device 41. Then, the second coupling portion 315 is screwed tight to the first coupling portion 411 to fix the wind-guiding cover 3 to the electronic device 41, and the second positioning portion 323 of the separator 32 is coupled to the first positioning portion 451 of the fan frame 45 of the electronic device 41. By operation of the heat dissipating member 44 mounted in the electronic device 41, air outside the electronic device 41 is introduced through the air inlet 413 of the electronic device 41 so as to dissipate heat generated by electronic components 46 disposed on a mainboard 42 of the electronic device 41 to outside of the electronic device 41 through an air outlet 414 of the electronic device 41, such that heat dissipation is performed for the electronic components 46.

Moreover, during the operation of the heat dissipating member 44, since the wind-guiding cover 3 is provided with the channel 312 of the main body 31 disposed between the heat generating component 43 and the air inlet 413, the fan 431 of the heat generating component 43 operates to introduce air outside the electronic device 41 through the air inlet 413 to the heat generating component 43, so as to dissipate heat generated by the heat generating component 43 through the fan 431 to outside of the server 1, such that heat dissipation is performed for the heat generating component 43. In the absence of the wind-guiding cover 3 in the electronic device 41, the heat dissipating member 44 during operation would undesirably draw the heat from the heat generating component 43, which is intended to be dissipated, into the electronic device 41, thereby adversely affecting the heat dissipating operation for the heat generating component 43 and making the heat generating component 43 not subject to satisfactory heat dissipation. With provision of the wind-guiding cover 3, the heat from the heat generating component 43 can be prevented from being drawn into the electronic device 41 by the heat dissipating member 44, and the external air can be introduced by the fan 431 through the wind-guiding cover 3 to dissipate the heat from the heat generating component 43.

When it is to disassemble the wind-guiding cover 3 from the electronic device 41, it can be accomplished by simply uncoupling the second coupling portion 315 of the main body 31 from the first coupling portion 411 of the electronic device 41, such that the wind-guiding cover 3 is convenient to be assembled and disassembled to and from the electronic device 41.

Second Preferred Embodiment

Figure 7:
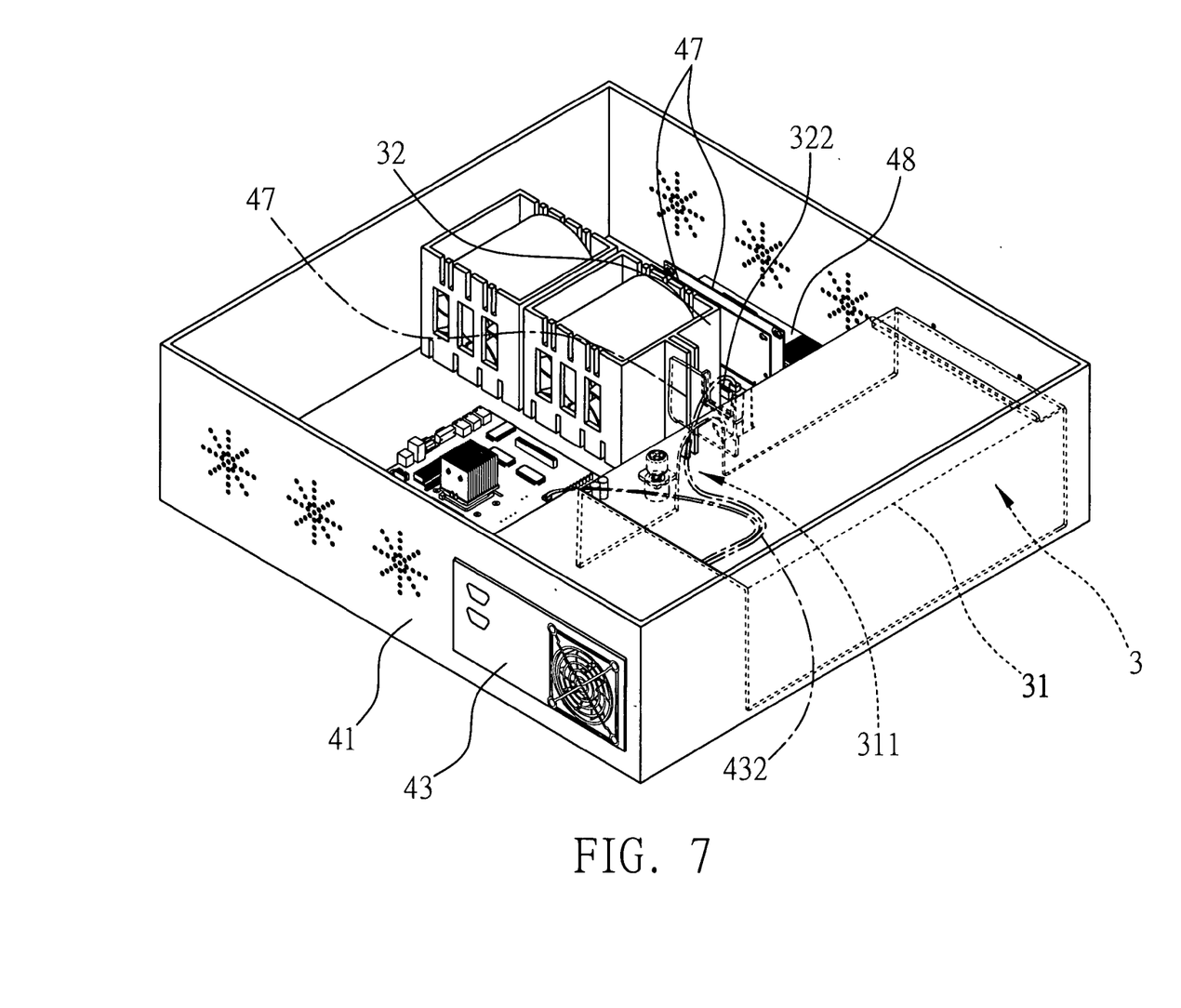
FIG. 7 is a perspective schematic diagram illustrating the wind-guiding cover according to a second preferred embodiment of the present invention applied to the electronic device.

FIG. 7 illustrates the wind-guiding cover 3 according to a second preferred embodiment of the present invention, wherein same or similar components as compared with those of the first embodiment are denoted with same or similar reference numerals, and their detailed descriptions are omitted here for the same of brevity.

Primary differences between the second embodiment and the first embodiment are in that, as shown in FIG. 7, the electronic device 41 is provided with a mainboard 48 on which a plurality of expansion cards 47 are mounted, and the separator 32 comprises a window board 321 that can be removed to form a gap 322 on the separator 32, to allow cables 432 for wiring of the heat generating component 43 to pass through the gap 322 to be connected to the mainboard 48 so as to supply power to the mainboard 48, thereby providing an effect of accommodating the cables 432 and properly arranging the wiring.

Therefore, by applying the wind-guiding cover of the present invention to the electronic device, a sufficient heat dissipating effect is provided for the heat generating component and the electronic components of the electronic device, and the wind-guiding cover is convenient to be assembled and disassembled to and from the electronic device and has a wiring arrangement function, thereby overcoming the drawbacks in the prior art.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A wind-guiding cover mounted in an electronic device having a heat generating component, a first coupling portion, a first positioning portion and an air inlet, the heat generating component having a fan, the wind-guiding cover comprising:
a main body disposed between the heat generating component and the air inlet, the main body comprising a channel for connecting the heat generating component to the air inlet, and a second coupling portion for being coupled to the first coupling portion, so as to allow the fan to directly introduce air from the air inlet to the heat generating component to dissipate heat generated by the heat generating component; and
a separator connected to a side of the main body and has a second positioning portion for being coupled to the first positioning portion, the first positioning portion being a slot formed on a side of a fan frame of the electronic device.

2. The wind-guiding cover of claim 1, wherein the first coupling portion and the second coupling portion comprise a screw hole and a screw member, respectively.

3. The wind-guiding cover of claim 2, wherein the screw member is a positioning bolt coupled and fixed to the main body.

4. The wind-guiding cover of claim 1, wherein the main body has an opening formed on a side thereof relatively close to the separator, for allowing wiring for connecting the heat generating component to the electronic device to penetrate the opening.

5. The wind-guiding cover of claim 1, wherein the separator is provided with a window board that is removable to form a gap on the separator.

6. The wind-guiding cover of claim 1, wherein the second positioning portion is a protruding block.

7. The wind-guiding cover of claim 1, wherein the heat generating component is a power supply.

8. The wind-guiding cover of claim, 1, wherein the electronic device is a server.

* * * * *